US012627298B2

(12) United States Patent

Nagata et al.

(10) Patent No.: US 12,627,298 B2
(45) Date of Patent: May 12, 2026

(54) CIRCUITRY AND A METHOD FOR GENERATING A SET OF OUTPUT CLOCK SIGNALS

(71) Applicant: IMEC VZW, Leuven (BE)

(72) Inventors: Shun Nagata, Leuven (BE); Ewout Martens, Heverlee (BE); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 144 days.

(21) Appl. No.: 18/444,835

(22) Filed: Feb. 19, 2024

(65) Prior Publication Data

US 2024/0283457 A1 Aug. 22, 2024

(30) Foreign Application Priority Data

Feb. 20, 2023 (EP) ..................................... 23157525

(51) Int. Cl.
*G06F 1/04* (2006.01)
*H03K 19/20* (2006.01)

(52) U.S. Cl.
CPC .................................... *H03K 19/20* (2013.01)

(58) Field of Classification Search
CPC .. H03K 5/15; H03K 5/15013; H03K 5/15026; H03K 19/20; H03K 2005/00286;
(Continued)

(56) References Cited

U.S. PATENT DOCUMENTS

| | | |
|---|---|---|
| 2012/0056644 A1 | 3/2012 | Kondou |
| 2016/0285436 A1 | 9/2016 | Neidengard et al. |

(Continued)

FOREIGN PATENT DOCUMENTS

| | | |
|---|---|---|
| JP | 2008-294492 A | 12/2008 |
| JP | 2012-060319 A | 3/2012 |

(Continued)

OTHER PUBLICATIONS

Mao et al: "New Frequency Divider with 8 Output Phases for Phase Switching Prescaler", 2006 International Conference on Communications, Circuits and Systems, Guilin, China, 2006, downloaded on May 25, 2022, pp. 2588-2591.

(Continued)

*Primary Examiner* — Long Nguyen
(74) *Attorney, Agent, or Firm* — MOSER TABOADA

(57) ABSTRACT

A circuitry for generating output clock signals with increasing phase delays comprises: an input receiving input clock signals with increasing phase delays, wherein the output clock signals are twice as many as the input clock signals; logic components connected in a loop with an output from a component connected as a first input to a following component, wherein the output is further connected as a second input to an oppositely positioned component; wherein each component receives the first, the second and a third input signal; wherein pairs of oppositely positioned components receive a common input clock signal and mask out the third input clock signal based on logic state of first and second input signals such that the outputs are phase shifted by 180 degrees; and wherein the circuitry outputs the output clock signals based on outputs from each component.

5 Claims, 10 Drawing Sheets

(58) Field of Classification Search
CPC ... H03K 2005/00293; G06F 1/04; G06F 1/06;
G06F 1/08; G06F 1/12
See application file for complete search history.

(56) References Cited

U.S. PATENT DOCUMENTS

2021/0048839 A1    2/2021  Connell et al.
2023/0336163 A1*  10/2023  Chen ......................... G06F 1/06

FOREIGN PATENT DOCUMENTS

WO     WO-2022/133988 A1    6/2022
WO     WO-2022/161911 A1    8/2022

OTHER PUBLICATIONS

Chen et al: "A DLL-based variable-phase clock buffer", IEEE Transactions on Circuits and Systems—II: Express Briefs, vol. 54, No. 12, 2007, pp. 1072-1076.
Yang et al: "An Open-Loop 10GHz 8-Phase Clock Generator in 65nm CMOS", 2011 IEEE Custom Integrated Circuits Conference, 2011, downloaded on May 3, 2022, pp. 1-4.
Thijssen et al: "A 370µW 5.5dB-NF BLE/BT5.0/IEEE 802.15.4-Compliant Receiver with >63dB Adjacent Channel Rejection at >2 Channels Offset in 22nm FDSOI", 2020 IEEE International Solid-State Circuits Conference, San Francisco, USA, 2020, pp. 1-5.
Extended European Search Report in EP23157525.9 dated Aug. 2, 2023, 12 pages.

* cited by examiner

| IN | | | OUT |
|----|----|----|-----|
| A | B | C | X |
| 0 | 0 | 0 | 1 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

| IN | | | OUT |
|----|----|----|-----|
| A´ | B´ | C´ | X´ |
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

*DIV2 \* 2*
*(4phase frequency divider \* 2)*
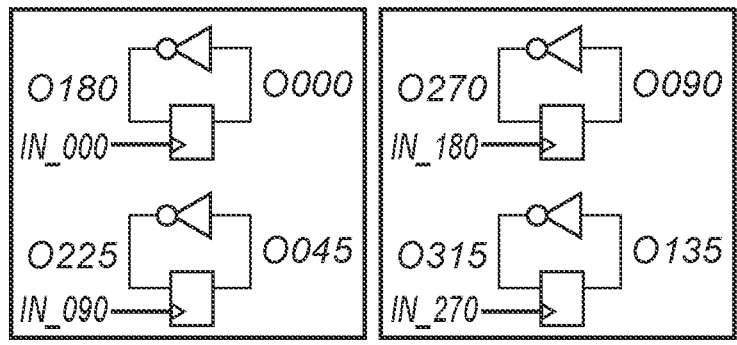
*4BITSR*
*(4bit shift register with 4-phase input)*
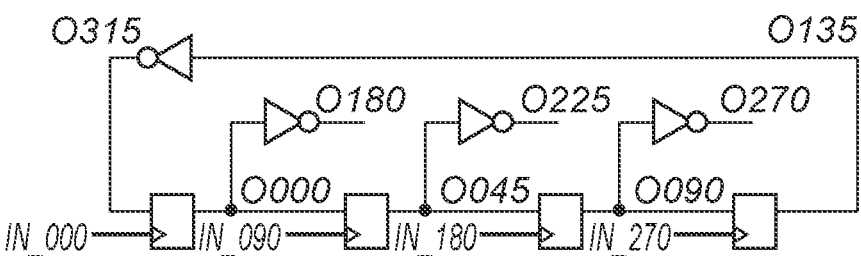
*(Prior art)* Fig. 4

CIRCUITRY AND A METHOD FOR GENERATING A SET OF OUTPUT CLOCK SIGNALS

CROSS-REFERENCE TO RELATED APPLICATIONS

The present application claims the benefit of and priority to EP Patent Application Serial No. 23157525.9, filed Feb. 20, 2023, the entire contents of which is incorporated herein by reference.

TECHNICAL FIELD

The present description relates to a circuitry and a method for generating a set of output clock signals.

BACKGROUND

In some applications, a set of clock signals defining a plurality of clock signals with increasing phase delays, which may also be referred to as a multi-phase clock signal, are used. The plurality of clock signals provides pulses with different timing which may be used for providing different clock signals to different components in a circuit. For instance, having a large number of clock signals, such as 8, may be required for a high-speed time-interleaved analog-to-digital converter (ADC) or a phased array system.

There are available architectures for 4-phase clock signal generators, such as using a frequency divider generating 4-phase clock signals from a differential input clock signal. However, there are difficulties when generating a larger set of clock signals is needed, such as an 8-phase clock signal. For instance, an 8-phase clock signal generator can be realized by one or more phase interpolator circuits, optionally in combination with 4-phase clock generators. However, the phase interpolator circuit needs calibration to obtain a good phase accuracy between 8 phases which also needs to track, e.g., temperature variations. The phase interpolator circuit may thus include a programmable delay line which limits the input frequency of the clock generator to a narrow frequency range.

In WO 2022/133988, a multi-phase clock generation circuit is disclosed. The multi-phase clock generation circuit is used for generating multi-phase non-overlapping clock signals. The multi-phase clock generation circuit comprises a loop structure formed by the input ends and output ends of a plurality of logic gates being electrically connected end to end, and a plurality of latches used for lathing the signals of the input ends of the logic gates. However, use of logic gates as well as latches reduces robustness of the circuit, maximum frequency of operation, and there is also a risk of phase swapping occurring, i.e., that order of phases output by the plurality of logic gates is changed.

SUMMARY

An objective of the present description is to provide a circuitry and method for generating a set of output clock signals with increasing phase delays, wherein a robust and reliable generation of clock signals at high speed is provided.

This and other objectives are at least partly met by the invention as defined in the independent claims. Preferred embodiments are set out in the dependent claims.

According to a first aspect, there is provided a circuitry for generating a set of output clock signals defining a plurality of output clock signals with increasing phase delays, said circuitry comprising: an input configured to receive a set of input clock signals defining a plurality of input clock signals with increasing phase delays, wherein a number of the plurality of output clock signals is twice as large as a number of input clock signals; a plurality of logic components, wherein a number of the plurality of logic components is twice as large as a number of input clock signals, wherein the plurality of logic components is connected in a loop such that an output from each respective logic component of the plurality of logic components is connected as a first input to a respective following logic component of the plurality of logic components in the loop, wherein the output of each respective logic component is further connected as a second input to a respective logic component oppositely positioned in the loop; wherein each logic component is configured to receive the first, the second and a third input signal and provide the output, wherein the third input signal is an input clock signal of the plurality of input clock signals; wherein pairs of logic components oppositely positioned in the loop are configured to receive a common input clock signal of the plurality of input clock signals and different pairs of logic components oppositely positioned in the loop are configured to receive different input clock signals of the plurality of input clock signals and wherein logic components arranged in a sequence in the loop are configured to receive different input clock signals in a sequence defining increasing phase delay, wherein for each pair of logic components the oppositely positioned logic components are configured to mask out the third input clock signal based on logic state of first and second input signals such that the outputs of the oppositely positioned logic components are phase shifted by 180 degrees with respect to each other; and wherein the circuitry is configured to output the set of output clock signals based on outputs from each logic component.

The circuitry comprises a plurality of logic components, wherein each logic component is configured to receive three input signals. The logic components are configured to mask out the third input signal (input clock signal) using the first and second input signals. Thanks to using the first and second input signals to mask out the input clock signal and thanks to the output from a logic component being provided as input to an oppositely positioned logic component in the loop, the circuitry provides a fixed order of increasing phase delays of the output clock signals.

Hence, the circuitry is robust and reliable in providing a set of output clock signals wherein an order of phase delays among the output clock signals is fixed.

The circuitry is configured to generate a number of output clock signals that is double the number of input clock signals.

The circuitry may provide a high phase accuracy of the output clock signals since all output clock signals are generated according to a common scheme.

The circuitry may work with high input frequencies. For instance, the circuitry does not need to involve any D-type flip-flop circuits or latches (which are used in some prior art multi-phase clock signal generators) and therefore avoids propagation delays associated with such circuits. Further, the circuitry may support a wide input frequency range. This also implies that the circuitry enables output of clock signals with a high frequency, wherein the output frequency of the set of output clock signals corresponds to input frequency divided by two.

The invention may be particularly beneficial when generating output clock signals with a large number of different phase delays, such as when generating 8 output clock signals with different phase delays. However, it should be realized that the circuitry according to the first aspect may be generally used and need not necessarily be configured to generate 8 output clock signals from 4 input clock signals. Thus, the circuitry may for instance be used for generating 4 output clock signals based on 2 input clock signals. However, it should be realized that the circuitry may be particularly useful for generating 8 (or more) output clock signals, since adequate alternatives for generating the output clock signals may then not be readily available.

The plurality of output clock signals having increasing phase delays implies that each output clock signal in the plurality of output clock signals has a unique phase delay. Further, the phase delays of all of the output clock signals are within a single period of the output clock signals. In other words, the phase delays vary between 0° and 360°. The phase delay of the output clock signals may be defined by a rising edge or a falling edge of the output clock signal.

The plurality of logic components may be connected in a loop. This implies that output of a logic component is connected to an input of a following component. The logic components may thus form a sequence of logic components within the loop, wherein output from a logic component is connected to an immediately following logic component in the sequence and output from a last component in the sequence is further connected to the input of a first component in the sequence to close the loop.

It should be realized that the logic components being connected in a loop does not necessarily imply a particular physical arrangement or physical relationship between the logical components. Rather, the logic components being connected in the loop only defines an order in which the logic components are connected. However, it should be realized that the logic components may advantageously be arranged in a physical loop, such as in a ring, since this may be a suitable manner of physically arranging the logic components.

Two logic components being oppositely positioned in the loop implies that a distance between the logic components in the sequence corresponds to half a number of logic components in the sequence. This would correspond to the logic components being diametrically opposite to each other should the logic components be arranged in a ring. In other words, the oppositely positioned component to a logic component having a sequence index i is defined as $(i+N/2)$ mod N, where N is the total number of logic components in the sequence and mod is the modulo operation.

Each logic component is configured to receive three input signals and to mask out the input clock signal (third input signal) based on logic state of the first and second input signals. This implies that the logic states of the first and second input signals control whether a logic state of the third input signal is to be changed for forming the input or whether the logic state of the third input signal may be passed to the output.

According to an embodiment, each of the plurality of logic components is configured to define a NOR function or a NAND function of the first, second, and third input signals for masking out the third input clock signal based on logic state of first and second input signals.

Each of the plurality of logic components may be configured to define the same function. Thus, each of the plurality of logic components may be configured to define a NOR function. Alternatively, each of the plurality of logic components may be configured to define a NAND function.

The masking out of the third input clock signal using a NOR function or a NAND function may be sufficient for the plurality of logic components being able to provide the set of output clock signals. This implies that no further function of the logic components may be necessary, and that the circuitry may be simple.

According to an embodiment, each of the plurality of logic components is formed by a NOR logic gate or a NAND logic gate being a single logic gate of the logic component.

Each of the plurality of logic components may be formed by a same type of logic gate. Thus, each of the plurality of logic components may be formed by a NOR logic gate. Alternatively, each of the plurality of logic components may be formed by a NAND logic gate.

Thus, each logic component may be formed by a single logic gate. This implies that the circuitry may be implemented using a small number of components. This implies that the circuitry may be formed in a small area, such that a compact circuitry may be provided. Further, a risk of any mismatch of the logic components in the circuitry from manufacturing of the circuitry may be low.

Further, thanks to the same type of single logic gate being used for each of the logic components, the circuitry may be very robust and tolerant to any process, voltage, or temperature (PVT) variations.

Thanks to the use of a single logic gate for each of the plurality of logic components, the circuitry may provide a low clock jitter enabling the circuitry to be used with a high input frequency and supporting a wide input frequency range.

According to an embodiment, the circuitry is configured to receive a 4-phase quadrature input clock signal and to output an 8-phase clock signal.

This is a suitable manner for forming an 8-phase output clock signal.

According to an embodiment, the circuitry is configured to receive the input clock signal having a duty cycle of a state to be masked out by the logic components of at least 25%, such as in a range of 25-75%, such as in a range of 40-60%, such as 50%.

The state of the third input signal (input clock signal) to be masked out depends on the logic component used in the circuitry. If a NOR function is used, a first or a second low state in two periods of the third input signal will be masked out, whereas if a NAND function is used, a first or a second high state in two periods of the third input signal will be masked out.

Having a duty cycle of the state to be masked out of at least 25% implies that the input clock signal exhibits the state to be masked out during at least 25% of two full periods of the input clock signal. Using a duty cycle of at least 25% may ensure that the third input signal may be properly processed by the logic components to generate the set of output clock signals with increasing phase delays.

According to an embodiment, the circuitry is configured to output the multi-phase clock signal with an overlap between pulses of sequential phases in the multi-phase clock signal.

This implies that pulses of different output clock signals in the set of output clock signals may partially overlap. However, the rising and falling edges of the pulses of different output clock signals will not overlap. The rising and/or falling edges may be used for providing a clock function of the clock signals.

According to an embodiment, a frequency of the output multi-phase clock signal is half of a frequency of the input clock signal.

In other words, the circuitry may be configured to generate the set of output clock signals with half a frequency of the input clock signals.

According to a second aspect, there is provided a method for generating a set of output clock signals defining a plurality of output clock signals with increasing phase delays, said method comprising: receiving a set of input clock signals defining a plurality of input clock signals with increasing phase delays, wherein a number of the plurality of output clock signals is twice as large as a number of input clock signals; inputting the set of input clock signals to logic components, wherein a number of the plurality of logic components is twice as large as a number of input clock signals, wherein the plurality of logic components is connected in a loop such that an output from each respective logic component of the plurality of logic components is connected as a first input to a respective following logic component of the plurality of logic components in the loop, wherein the output of each respective logic component is further connected as a second input to a respective logic component oppositely positioned in the loop, wherein each logic component is configured to receive the first, the second and a third input signal, wherein the third input signal is based on the plurality of input clock signals, wherein pairs of logic components oppositely positioned in the loop are configured to receive a common input clock signal of the plurality of input clock signals and different pairs of logic components oppositely positioned in the loop are configured to receive different input clock signals of the plurality of input clock signals and wherein logic components arranged in a sequence in the loop are configured to receive different input clock signals in a sequence defining increasing phase delay; processing the set of input clock signals by the logic components for outputting a set of output clock signals, wherein each of the logic components outputs a respective output clock signal of the plurality of output clock signals, wherein for each pair of logic components the oppositely positioned logic components are configured to mask out the third input clock signal based on logic state of the first and second input signals such that the outputs of the oppositely positioned logic components are phase shifted by 180 degrees with respect to each other.

Effects and features of this second aspect are largely analogous to those described above in connection with the first aspect. Embodiments mentioned in relation to the second aspect are largely compatible with the first aspect.

The method provides a robust and reliable manner of providing a set of output clock signals wherein an order of phase delays among the output clock signals is fixed.

BRIEF DESCRIPTION OF THE DRAWINGS

The above, as well as additional objects, features, and advantages of the present description, will be better understood through the following illustrative and non-limiting detailed description, with reference to the appended drawings. In the drawings like reference numerals will be used for like elements unless stated otherwise.

FIG. 4 is a schematic view of two different prior art circuitries.

DETAILED DESCRIPTION

Figure 1A:
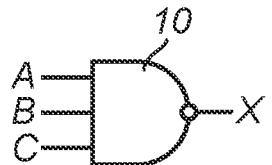
FIG. 1a is a schematic view of a NAND gate and shows a table of function of the NAND gate.
Figure 1B:
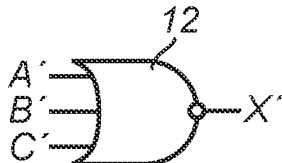
FIG. 1b is a schematic view of a NOR gate and shows a table of function of the NOR gate.

Referring now to FIGS. 1a-b, the well-known functionality of NAND gates and NOR gates is shown.

FIG. 1a illustrates a NAND gate 10, having three input signals A, B, and C and providing one output signal X. FIG. 1a further shows in a table a value of the output signal X as function of different values of the input signals A, B, and C. As may be seen in FIG. 1a, the output signal X is low (0) only when all of the input signals A, B, and C are high (1) and, for all other cases, the output signal X is high (1).

FIG. 1b illustrates a NOR gate 20, having three input signals A', B', and C' and providing one output signal X'. FIG. 1b further shows in a table a value of the output signal X' as function of different values of the input signals A', B', and C'. As may be seen in FIG. 1b, the output signal X' is high (1) only when all of the input signals A', B', and C' are low (0) and, for all other cases, the output signal X' is low (0).

Figure 2A:
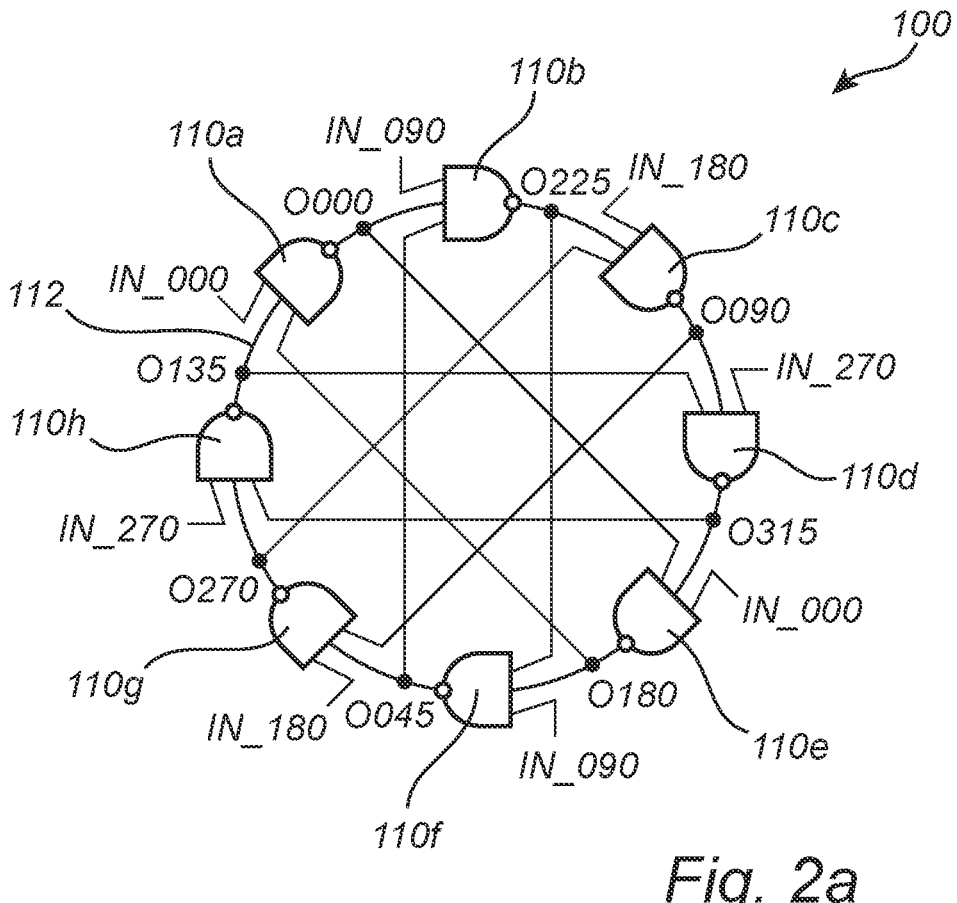
FIG. 2a is a schematic view of a circuitry according to a first embodiment using NAND gates.
Figures 2B, 2C:
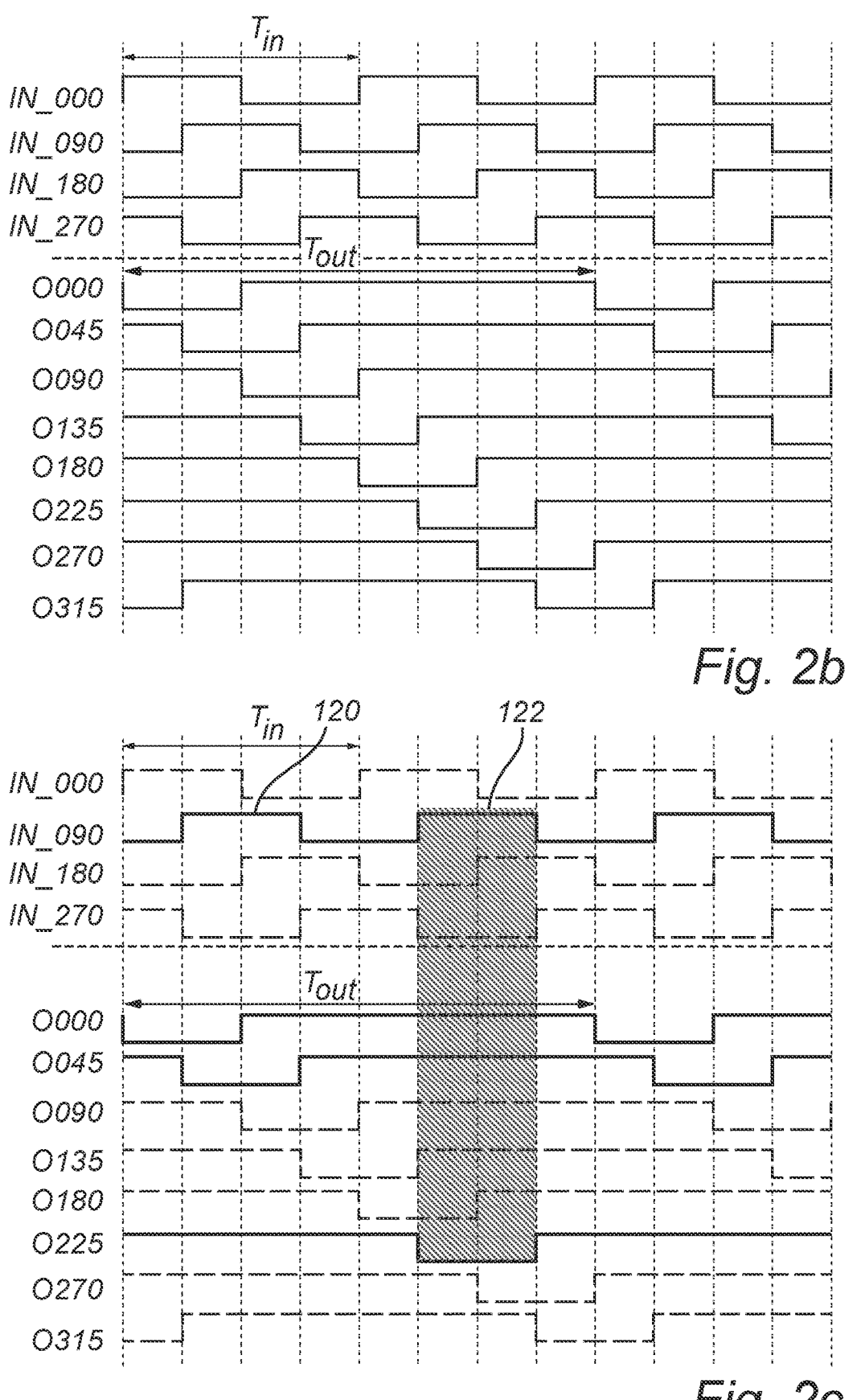
FIG. 2b is a waveform view of input signals and output signals of the circuitry of the first embodiment.
FIG. 2c is a waveform view of input signals and output signals of the circuitry of the first embodiment highlighting processing of signals performed by a single logic component in the circuitry.

Referring now to FIGS. 2a-c, a circuitry 100 according to a first embodiment will be described. FIG. 2a is a schematic view of the circuitry 100, whereas FIG. 2b is a waveform view of input signals and output signals.

The circuitry 100 is configured to receive a set of input clock signals. As shown in FIG. 2b, a set of four input clock signals IN_000, IN_090, IN_180, and IN_270 may be provided. The four input clock signals IN_000, IN_090, IN_180, and IN_270 may be referred to as a four-phase quadrature input clock signal.

The four input clock signals are provided with an increasing phase delay. Using input clock signal IN_000 as reference and defining a full period Tin of the input clock signal as a time duration during which the input clock signal is maintained high followed by the input clock signal being maintained low, a phase delay of a rising edge of the input clock signals is 0°, 90°, 180°, and 270° for the input clock signals IN_000, IN_090, IN_180, and IN_270, respectively.

The circuitry 100 comprises a plurality of logic components 110a-h connected in a loop 112.

Each of the input clock signals of the set of input clock signals may be received on a separate line forming inputs to the circuitry 100. The input clock signals may further be input to the plurality of logic components 110a-h such that different logic components 110a-h receive different input clock signals, as will explained in further detail below.

Each logic component 110a-h is formed by a NAND gate. The NAND gates 110a-h being connected in a loop 112 implies that the NAND gates 110a-h form a sequence of NAND gates 110a-h with an output from one NAND gate being connected as a first input to a following NAND-gate in the sequence. Further, the output from the last NAND gate 110h in the sequence is connected as a first input to the first NAND gate 110a in the sequence.

In addition, the output of each respective NAND gate 110a-h is further connected as a second input to a respective NAND gate 110a-h oppositely positioned in the loop 112. The oppositely positioned component to a NAND gate having a sequence index i has a sequence index corresponding to I+N/2 or i–N/2, where N is the total number of NAND gates in the sequence and i is in the range from 1 to N. Oppositely positioned NAND gates could be viewed as forming pairs of NAND gates with the output from one NAND gate in the pair being connected as a second input to the other NAND gate in the pair and vice versa.

Thus, the NAND gates 110a and 110e form a first pair of NAND gates, the NAND gates 110b and 110f form a second pair of NAND gates, the NAND gates 110c and 110g form a third pair of NAND gates, and the NAND gates 110d and 110h form a fourth pair of NAND gates. The NAND gates in each pair of NAND gates are configured to receive a common input clock signal, whereas the NAND gates of different pairs are configured to receive different input clock signals.

Input clock signals with an increasing phase delay are sequentially provided in the sequence of NAND gates 110a-h in the loop 112. Thus, the first NAND gate 110a (and fifth NAND gate 110e) are configured to receive the input clock signal IN_000, the second NAND gate 110b (and sixth NAND gate 110f) are configured to receive the input clock signal IN_090, the third NAND gate 110c (and seventh NAND gate 110g) are configured to receive the input clock signal IN_180, and the fourth NAND gate 110d (and eight NAND gate 110h) are configured to receive the input clock signal IN_270.

Each NAND gate 110a-h is thus configured to receive a first input signal from a previous NAND gate in the sequence of NAND gates, a second input signal from an oppositely positioned NAND gate and a third input signal being an input clock signal. The first and second input signals are configured to mask out the third input clock signal based on logic states of the input signals to form an output signal.

The output signals of the NAND gates 110a-h have a high logic state with a shorter pulse of a low logic state. The output signals of the NAND gates 110a-h are mutually unique in that the timing of the pulse of the low logic state is different for the different output signals. The output signals of the NAND gates 110a-h have an increasing phase delay of the pulse of the low logic state with a partial overlap between pulses of sequential phases.

Using output clock signal O000 from the first NAND gate 110a-h as reference and defining a full period $T_{out}$ of the output clock signal as a time duration during which the output clock signal is maintained low followed by the output clock signal being maintained high, a phase delay of a falling edge of the output clock signals is 0°, 45°, 90°, 135°, 180°, 225°, 270°, and 315°, respectively. The outputs from the NAND gates 110a-h thus form a set of output clock signals for outputting an 8-phase clock signal, wherein the number of output clock signals is twice as large as the number of input clock signals and is equal to the number of logic components 110a-h. Further, the frequency of the output clock signals is half of a frequency of the input clock signals.

The 8-phase clock signals are output with a good phase accuracy because all output clock signals are generated using a same strategy.

Referring now to FIG. 2c, function of the second NAND gate 110b to mask out the input clock signal based on logic state of the first and second input signals will be described in further detail.

As illustrated in FIG. 2c, the second NAND gate 110b receives the output O000 of the first NAND gate 110a as the first input signal, receives the output O0045 of the sixth NAND gate 110e as the second input signal and receives the input clock signal IN_090 as the third input signal. The second NAND gate 110b provides signal O225 as its output signal.

FIG. 2c shows that during a first pulse 120 in which the input clock signal is high, the second input signal is low such that the output signal of the second NAND gate 110b will be high. However, during a second pulse 122 in which the input clock signal is high, the first and second input signals are both high and the output signal of the second NAND gate 110b will assume a pulse of a low state (as indicated in shading in FIG. 2c). In this way, the third input clock signal will be masked out to define a pulse of a low state of the output signal which may be used as a clock function.

Further, pairs of NAND gates receive the same input clock signal. Thus, the sixth NAND gate 110f receives the input clock signal IN_090. The sixth NAND gate 110f masks out the input clock signal IN_090 based on receiving O180 as a first input signal and receiving O225 as a second input signal, such that during the first pulse 120 in which the input clock signal is high, the first and second input signals are both high and the output signal of the sixth NAND gate 110f will assume a pulse of a low state. Thus, the outputs of the oppositely positioned NAND gates in a pair of NAND gates are phase shifted by 180 degrees with respect to each other.

Figures 3A, 3B:
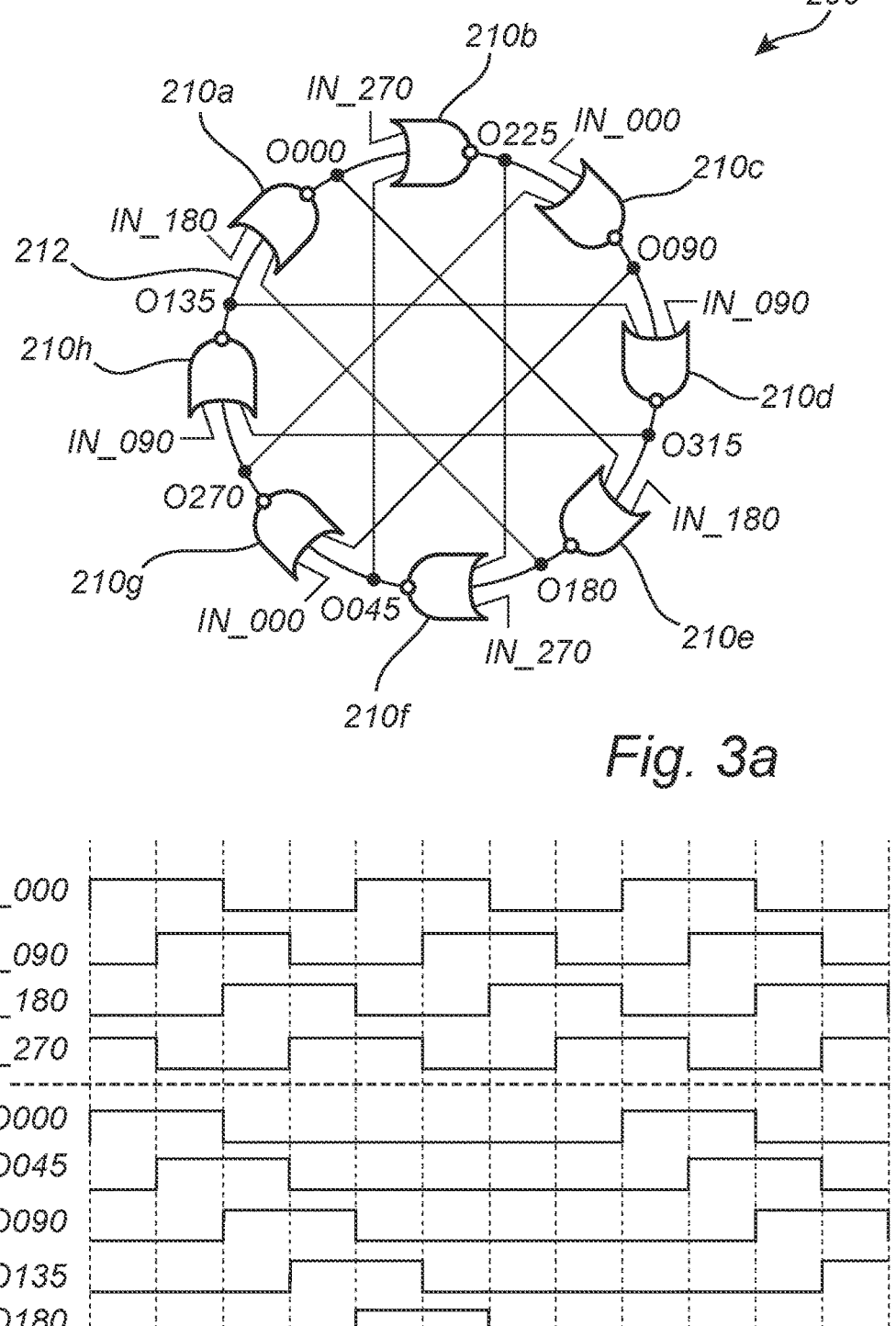
FIG. 3a is a schematic view of a circuitry according to a second embodiment using NOR gates.
FIG. 3b is a waveform view of input signals and output signals of the circuitry of the second embodiment.

Referring now to FIGS. 3a-b, a circuitry 200 according to a second embodiment will be described. FIG. 3a is a schematic view of the circuitry 200, whereas FIG. 3b is a waveform view of input signals and output signals.

The circuitry 200 corresponds to the circuitry 100 and only differs in that the logic components 210a-h in the loop 212 are formed by NOR gates 210a-h instead of NAND gates 110a-h. The NOR gates 210a-h are connected in a same manner as described above for the NAND gates 110a-h.

The circuitry 200 is configured to receive the same set of input clock signals as received by the circuitry 100. As shown in FIG. 3b, the four-phase quadrature input clock signal is provided defining four input clock signals IN_000, IN_090, IN_180, and IN_270.

Since the function of the NOR gates 210a-h differs from the function of the NAND gates 110a-h, the output signals of the NOR gates 210a-h have a low logic state with a shorter pulse of a high logic state. The output signals of the NOR gates 210a-h are mutually unique in that the timing of the pulse of the high logic state is different for the different output signals. The output signals of the NOR gates 210a-h have an increasing phase delay of the pulse of the low logic state with a partial overlap between pulses of sequential phases.

Using output clock signal O000 from the first NOR gate 210a-h as reference and defining a full period $T_{out}$ of the output clock signal as a time duration during which the output clock signal is maintained high followed by the output clock signal being maintained low, a phase delay of a rising edge of the output clock signals is 0°, 45°, 90°, 135°, 180°, 225°, 270°, and 315°, respectively. The outputs from the NOR gates 210a-h thus form a set of output clock signals for outputting an 8-phase clock signal.

In the embodiments shown in FIGS. 2a and 3a, the logic components 110a-h and 210a-h are formed by a single logic gate, a NAND logic gate or a NOR logic gate, respectively.

Using a single logic gate in the logic components imply that there is only one logic gate between an input clock signal and an output clock signal. This implies that the circuitries 100, 200 shown in FIGS. 2a and 3a realizes a low clock jitter and may operate up to a high input frequency and within a wide input frequency range.

However, it should be realized that the logic components 110a-h, 210a-h need not necessarily be formed by a single logic gate. Rather, each of the logic components in the plurality of logic components may alternatively be config-ured to define a NAND function or a NOR function without necessarily being implemented by a single logic gate.

As shown in FIGS. 2b and 3b, the input clock signals may have a duty cycle of 50% (i.e., the durations of the input clock signal being high/low are equally long). However, it should be realized that the duty cycle of the state to be masked out (that is a high state for NAND gates or a low state for NOR gates) could be at least 25% such as in a range of 25-75%, such as in a range of 40-60%.

Referring now to FIGS. 4-8, some simulation results are shown. The circuitries 100, 200 shown in FIGS. 2a and 3a, respectively are compared to circuitries shown in FIG. 4.

FIG. 4 illustrates conventional 8-phase clock generators, namely two 4-phase frequency dividers composed of flip-flops (named as DIV2*2) and a shift register including 4 flipflops (named as 4BITSR). In this comparison, only standard cell logic is used for the flipflops in the DIV2*2 and 4BITSR architectures. The DIV2*2 and 4BITSR 8-phase clock generators are compared to the circuitry 100 using 3-input NAND gates (named as 3inND) and the circuitry 200 using 3-input NOR gates (named as 3inNR). For a fair comparison, all circuits are implemented with standard cell logic, no specific optimization of the logic circuitry was done.

Figure 5A:
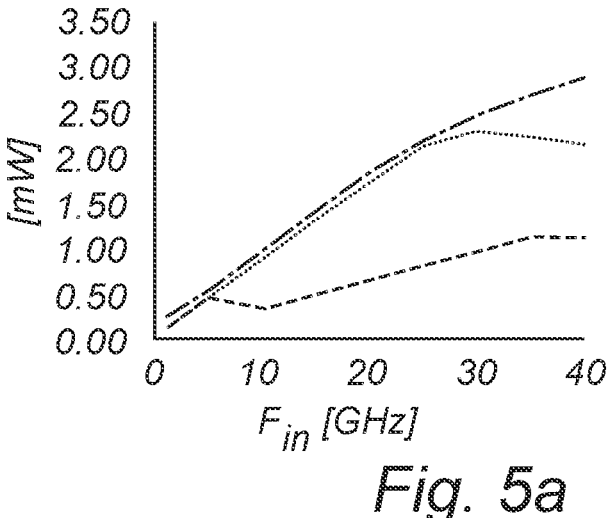
FIGS. 5a-b are graphs illustrating power consumption and output frequency as a function of input frequency for the circuitries according to the first and second embodiments and for the two prior art circuitries illustrated in FIG. 4.
Figure 5B:
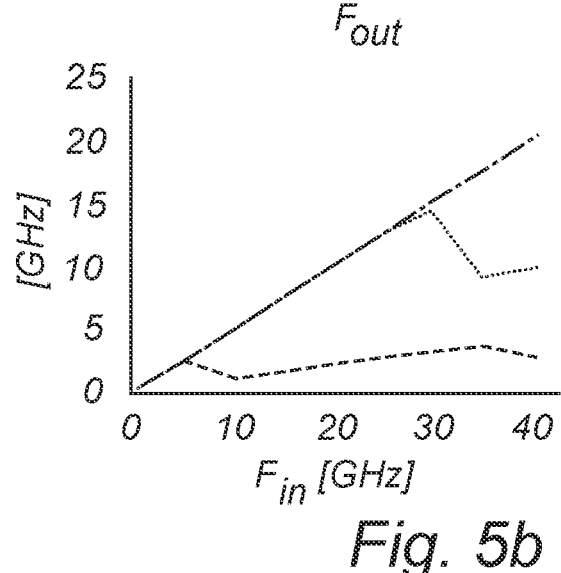

In FIGS. 5a-b, power consumption (FIG. 5a) and output frequency Fout (FIG. 5b) as function of input frequency Fin is shown for each architecture. The power consumption as function of input frequency becomes non-linear above a certain input frequency for the DIV2*2 and 4BITSR archi-tectures, which is an indication of the maximum input frequency supported. As may be seen from FIGS. 5a-b, the maximum input frequency is around 30 GHz for DIV2*2 and around 5 GHz for 4BITSR, whereas the 3inNR and 3inND architectures can operate at a higher input frequency than the DIV2*2 and 4BITSR architectures, at least up to a frequency of 40 GHz. It should be noted that the curves for the 3inNR and 3inND architectures are so close that they are not separable in FIGS. 5a-b.

Figure 6A:
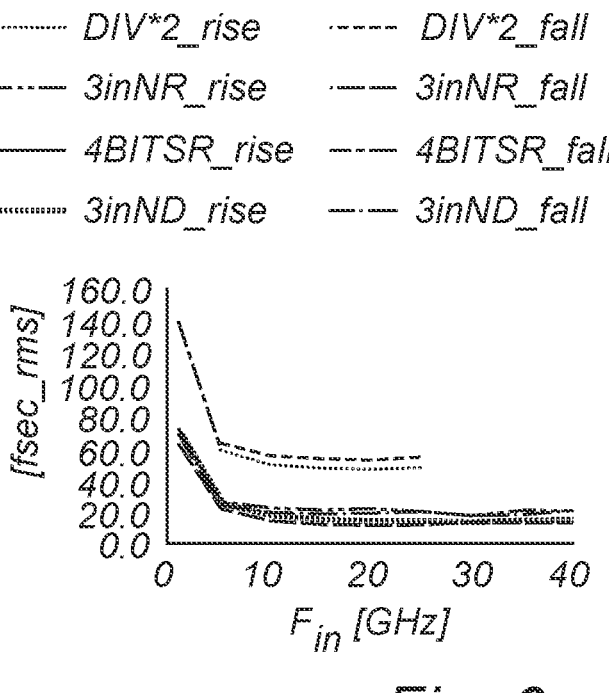
FIGS. 6a-b are graphs illustrating rising and falling edge jitter as a function of input frequency for the circuitries according to the first and second embodiments and for the two prior art circuitries illustrated in FIG. 4.
Figure 6B:
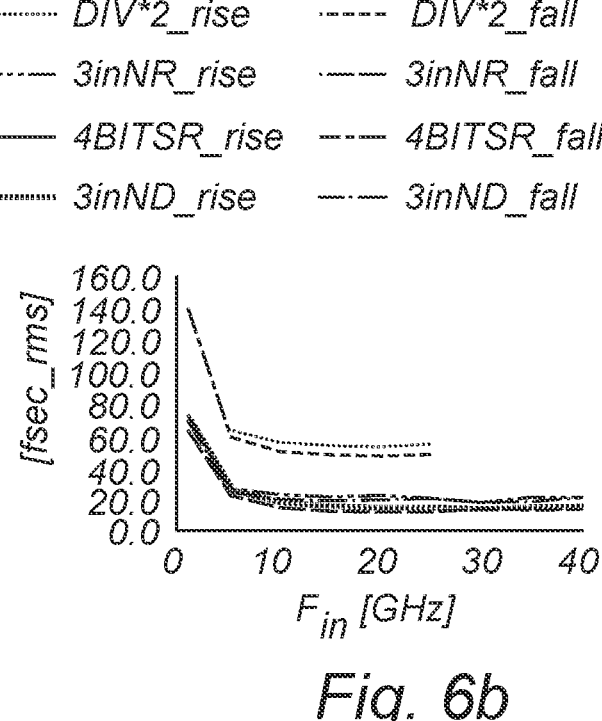

In FIGS. 6a-b, rising and falling edge jitter (using inte-gration range from 100 Hz to half of output frequency Fout/2) is shown as function of input frequency Fin until maximum input frequency. FIG. 6a shows the result for output signal O000, and FIG. 6b shows the result for output signal O180. These output signals are output clock signals in the 8-phase output clock signal. The jitter of 3inND and 3inNR architectures is clearly lower than that of DIV2*2 and 4BITSR.

Figure 7A:
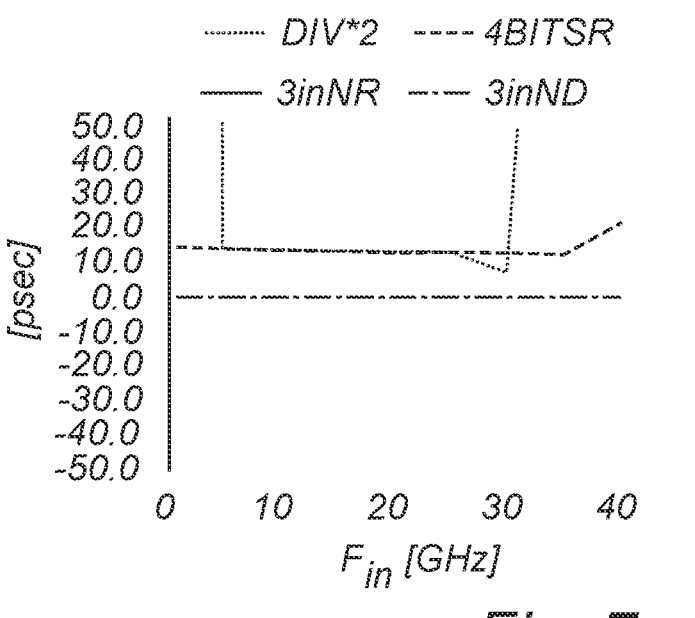
FIGS. 7a-b are graphs illustrating phase accuracy between rising edges or falling edges as a function of input frequency for the circuitries according to the first and second embodiments and for the two prior art circuitries illustrated in FIG. 4.
Figure 7B:
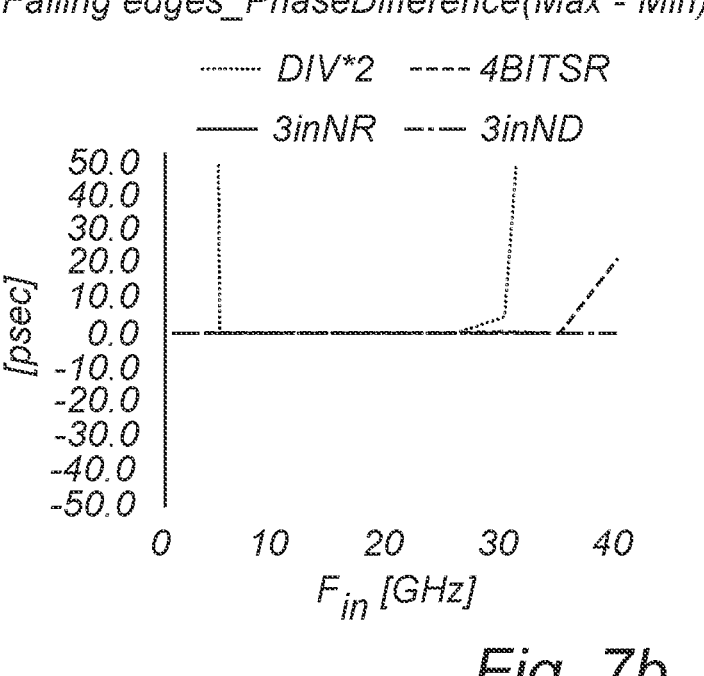

In FIGS. 7a-b, phase accuracy between rising edges (FIG. 7a) or falling edges (FIG. 7b) as function of Fin is shown. The phase accuracy value is calculated by subtracting the absolute value of the smallest phase difference in the 8 phases of the 8-phase output clock signal from the absolute value of the largest phase difference in the 8 phases. There-fore, a phase accuracy value of zero means there is no phase difference in the 8 phases. FIGS. 7a-b show that the 3inNR and 3inND architectures are superior to the DIV2*2 and 4BITSR architectures. It should be noted that the curves for the 3inNR and 3inND architectures are so close that they are not separable in FIGS. 7a-b.

Figure 8A:
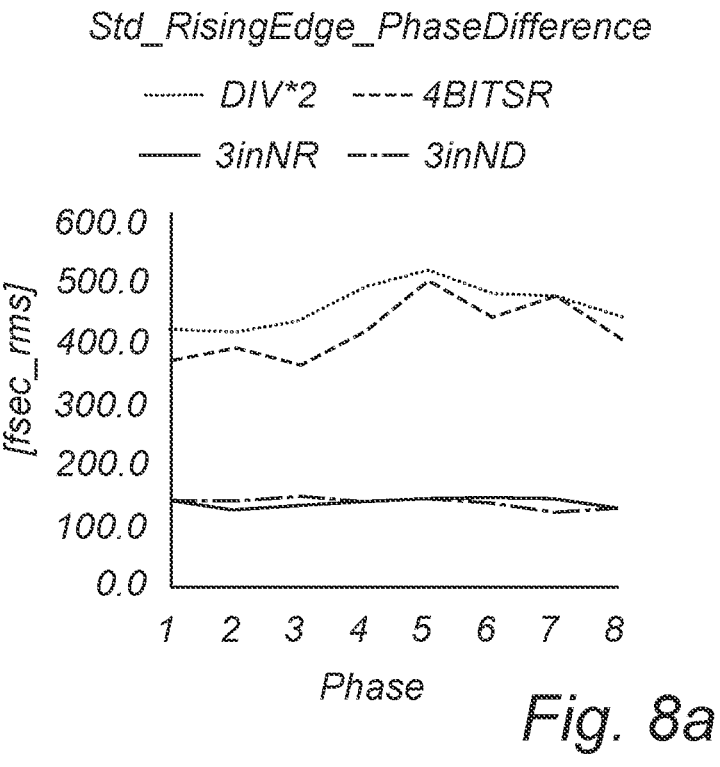
FIGS. 8a-b are graphs illustrating standard deviation of phase difference for rising edges and falling edges of the circuitries according to the first and second embodiments and for the two prior art circuitries illustrated in FIG. 4.
Figure 8B:
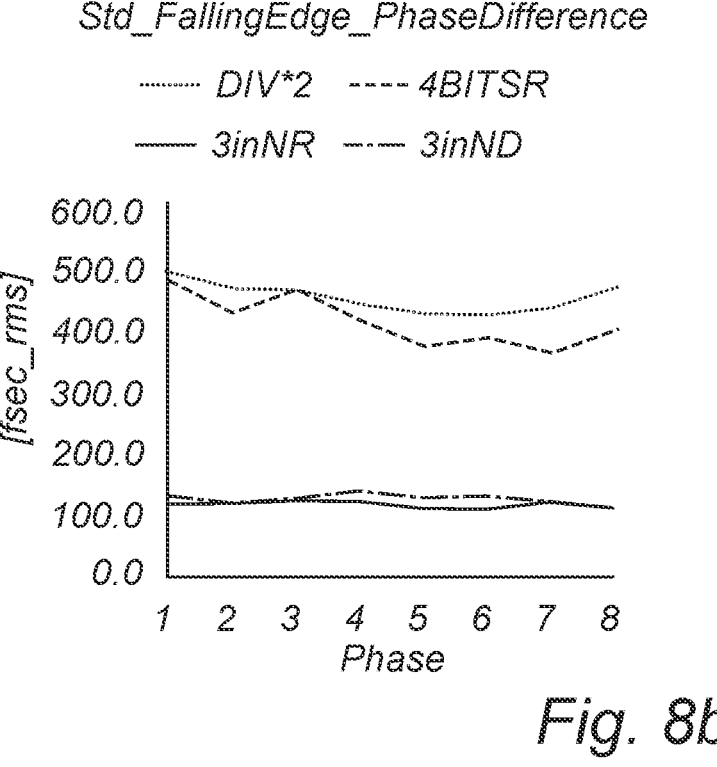

In FIGS. 8a-b, standard deviation of phase difference is shown for the rising edges (FIG. 8a) and falling edges (FIG. 8b) of the 8-phase output clock signal. The standard devia-tion of the phase differences is obtained via Monte-Carlo simulations with a trial number of 120. The standard devia-tion of the 3inND and 3inNR architectures is lower than that of the DIV2*2 and 4BITSR architectures. This may be thanks to the use of a single logic gate in each logic component of the 3inND and 3inNR architectures.

Figure 9:
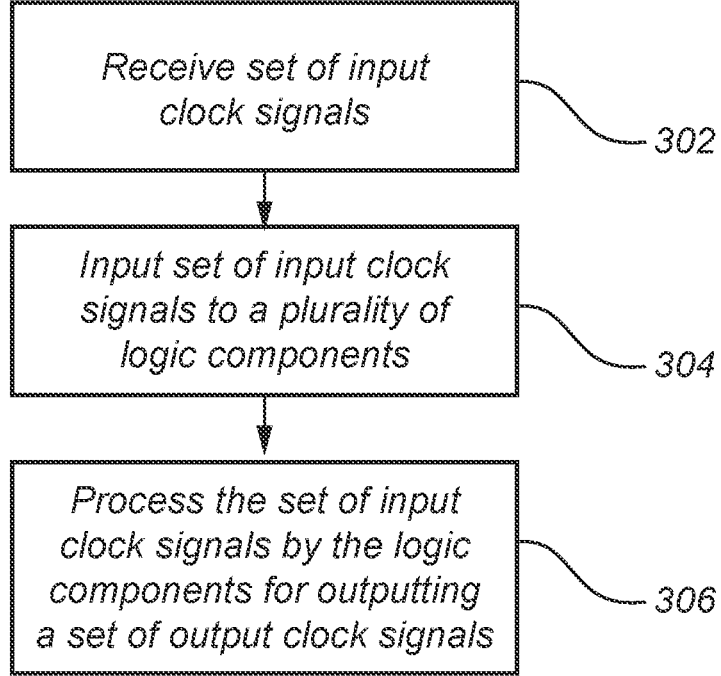
FIG. 9 is a flow chart of a method according to an embodiment.

Referring now to FIG. 9, a method for generating a set of output clock signals will be described.

The method comprises receiving 302 a set of input clock signals. The set of input clock signals define a plurality of input clock signals with increasing phase delays. The set of input clock signals may for instance be a 4-phase quadrature input clock signal.

The method further comprises inputting 304 the set of input clock signals to a plurality of logic components, wherein a number of the plurality of logic components is twice as large as a number of input clock signals. The logic components of the plurality of logic components are con-nected in a loop as explained above with reference to FIGS. 2a and 3a.

Each logic component is configured to receive a first input signal, a second input signal and a third input signal. The first and second input signals are received from outputs of other logic components in the loop, whereas the third input signal is an input clock signal of the plurality of input clock signals. Logic components that are oppositely positioned in the loop form a pair of logic components. The logic com-ponents of the pair are configured to receive a common input clock signal of the plurality of input clock signals. Different pairs of logic components are configured to receive different input clock signals of the plurality of input clock signals. Further, logic components arranged in a sequence in the loop are configured to receive different input clock signals in a sequence defining increasing phase delay.

The method further comprises processing 306 the set of input clock signals by the logic components for outputting a set of output clock signals. Each of the logic components outputs a respective output clock signal of the plurality of output clock signals. For each pair of logic components, the oppositely positioned logic components are configured to mask out the third input signal (input clock signal) based on logic state of the first and second input signals such that the outputs of the oppositely positioned logic components are phase shifted by 180 degrees with respect to each other.

Thus, the output signals from each of the logic compo-nents form output clock signals. A set of output clock signals is defined by the output signals from all of the logic components. The number of output clock signals is equal to the number of logic components. Since the number of logic components is twice the number of input clock signals, the number of output clock signals in the set of output clock signals is twice as large as the number of input clock signals.

The method generates a set of output clock signals defining a plurality of output clock signals with increasing phase delays. The output clock signals are provided with a fixed order of the phase delays, avoiding swapping orders of phases of the output clock signals which may otherwise cause substantial errors in circuitries being clocked by the set of output clock signals.

The method for generating the set of output clock signals may be performed by any of the circuitries 100 or 200 described above. It should further be realized that any variants of the circuitries 100, 200 discussed above may also be used in the method.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A circuitry for generating a set of output clock signals defining a plurality of output clock signals with increasing phase delays, said circuitry comprising:

an input configured to receive a set of input clock signals defining a plurality of input clock signals with increasing phase delays, wherein a number of the plurality of output clock signals is twice as large as a number of input clock signals;

a plurality of logic components, wherein a number of the plurality of logic components is twice as large as a number of input clock signals, wherein the plurality of logic components is connected in a loop such that an output from each respective logic component of the plurality of logic components is connected as a first input to a respective following logic component of the plurality of logic components in the loop, wherein the output of each respective logic component is further connected as a second input to a respective logic component oppositely positioned in the loop, wherein each of the plurality of logic components is formed by a NOR logic gate or a NAND logic gate being a single logic gate of the logic component;

wherein each logic component is configured to receive a first input signal at the first input, a second input signal at the second input, and a third input signal and provide the output, wherein the third input signal is an input clock signal of the plurality of input clock signals;

wherein pairs of logic components oppositely positioned in the loop are configured to receive a common input clock signal of the plurality of input clock signals and different pairs of logic components oppositely positioned in the loop are configured to receive different input clock signals of the plurality of input clock signals and wherein logic components arranged in a sequence in the loop are configured to receive different input clock signals in a sequence defining increasing phase delay, wherein for each pair of logic components the oppositely positioned logic components are configured to mask out the third input signal based on logic state of the first input and the second input such that the outputs of the oppositely positioned logic components are phase shifted by 180 degrees with respect to each other; and wherein the circuitry is configured to output the set of output clock signals based on outputs from each logic component.

2. The circuitry according to claim 1, wherein the circuitry is configured to receive a four-phase quadrature input clock signal that forms the set of input clock signals and to output an 8-phase clock signal as the set of output clock signals.

3. The circuitry according to claim 1, wherein the circuitry is configured to receive the input clock signal having a duty cycle of a state to be masked out by the logic components of at least 25%.

4. The circuitry according to claim 1, wherein the output clock signals are formed by a multi-phase clock signal, and the circuitry is configured to output the multi-phase clock signal with an overlap between pulses of sequential phases in the multi-phase clock signal.

5. The circuitry according to claim 1, wherein the output clock signals are formed by a multi-phase clock signal, and a frequency of the multi-phase clock signal is half of a frequency of the input clock signal.

* * * * *